United States Patent [19]
Wang et al.

[11] 4,260,647
[45] Apr. 7, 1981

[54] METHOD OF DEPOSITING AN ABRASIVE LAYER

[75] Inventors: Chih C. Wang, Hightstown; Ronald F. Bates, Trenton, both of N.J.

[73] Assignee: RCA Corporation, New York, N.Y.

[21] Appl. No.: 48,161

[22] Filed: Jun. 13, 1979

[51] Int. Cl.³ .............................................. B05D 3/06
[52] U.S. Cl. ....................................... 427/40; 427/41
[58] Field of Search ............................. 427/39, 40, 41

[56] References Cited

U.S. PATENT DOCUMENTS

| | | | |
|---|---|---|---|
| 3,262,808 | 7/1966 | Crooks et al. | 427/40 |
| 3,686,018 | 8/1972 | Lindblom et al. | 427/40 |
| 4,013,463 | 3/1977 | Leder | 427/39 X |
| 4,137,365 | 1/1979 | Fletcher et al. | 427/40 X |
| 4,138,306 | 2/1979 | Niwa | 427/39 |

*Primary Examiner*—Bernard D. Pianalto
*Attorney, Agent, or Firm*—Birgit E. Morris; Allen Bloom

[57] ABSTRACT

In a method for the glow discharge deposition of an amorphous, continuous layer from an organosilane and oxygen where the deposition is interrupted, wherein a glow discharge in oxygen is employed prior to resumption of glow discharge layer deposition.

8 Claims, 1 Drawing Figure

U.S. Patent  Apr. 7. 1981  4,260,647
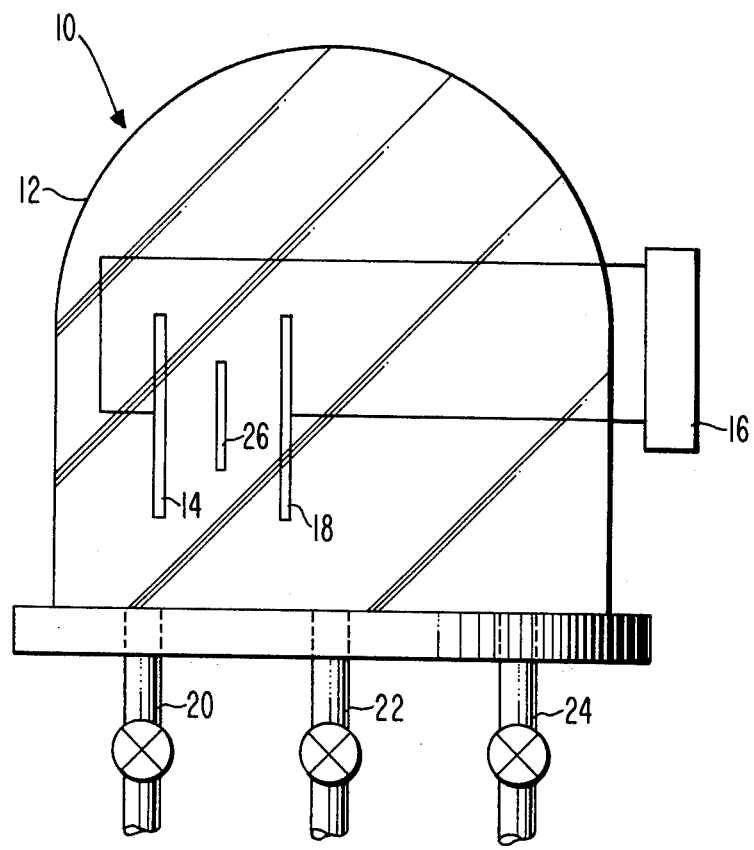

METHOD OF DEPOSITING AN ABRASIVE LAYER

This invention relates to a method for depositing a silicon oxide layer by a glow discharge technique. More specifically, this invention relates to an improved method of preparing a thick, continuous, silicon oxide coating by a glow discharge technique.

BACKGROUND OF THE INVENTION

The copending application, Ser. No. 048,166, filed June 13, 1979 of Dholakia entitled "Method for Precision Grinding of Sharp Tips," is being filed concurrently with the instant application. Dholakia discloses that a thick, abrasive silicon oxide layer can be used to lap the narrow, sharp point of a hard material such as diamond, sapphire and the like to a flat surface with a smooth finish. The Dholakia method both results in reduced breakage of the tips during lapping and prevents destruction of the lapping medium.

Several problems were encountered in the initial attempts to prepare thick $SiO_x$ abrasive layers by employing a glow discharge. $SiO_x$ may be thought of as a mixture of $SiO_2$ and $SiO$. The vinyl substrate, which is a preferred substrate, should not be heated above a temperature of about 50° C. Above this temperature the vinyl may warp due to stress relaxation which limits the disc's usefulness. This temperature sensitivity limits the maximum time the substrate may reside in the glow discharge. The maximum coating thickness which may be deposited for a given deposition rate is limited by the residence time. Several deposition steps, allowing the substrate to cool between them, are often required to produce a coating having the desired thickness.

$SiO_x$ layers may be glow discharge deposited using silane or certain of its derivatives as precursors. When organosilane precursors such as methyldimethoxysilane and tetraethoxysilane are employed, difficulties arise in the deposition of thick abrasive layers because of the reactivity of the organosilanes in the absence of the glow discharge plasma. These precursors condense to form thin amorphous films on the substrate in the presence of residual water or oxygen via hydrolysis or oxidation, respectively. The condensed materials adhere poorly to the substrate and cause coating inhomogeneity when they deposit on the intermediate layers between deposition cycles. Thus, in practice it is difficult to deposit a thick film by simply repeating the deposition at the time intervals set by the thermal sensitivity of the substrate in order to avoid the problem of excessive heating discussed above.

SUMMARY OF THE INVENTION

During the glow discharge deposition of an amorphous, continuous $SiO_x$ layer from organosilanes and oxygen, when it is necessary to interrupt the deposition, a glow discharge in an oxygen atmosphere prior to resumption of the glow discharge layer deposition results in improved adhesion, hardness, cohesion and homogeneity.

BRIEF DESCRIPTION OF THE DRAWING

The FIGURE is a cross-sectional view of an apparatus suitable for the glow-discharge deposition of a coating of the invention.

DETAILED DESCRIPTION OF THE INVENTION

A method of preparing a continuous, thick, amorphous, $SiO_x$ layer on a temperature sensitive substrate employs the glow discharge method and comprises the following steps: (a) depositing an abrasive layer on a suitable substrate in a glow discharge apparatus reaction chamber using an organosilane and oxygen as the starting materials, (b) shutting off the flow of the organosilane to the reaction chamber after the substrate has reached a temperature above which detrimental thermal affects may occur, (c) turning off the glow discharge power supply, (d) shutting off the oxygen supply to the reaction chamber, (e) cooling the substrate to about 25° C. under vacuum, (f) readmitting oxygen to the reaction chamber, (g) turning on the glow discharge power supply and allowing the glow discharge to operate in oxygen, (h) turning off the glow discharge power supply, (i) readmitting the organosilane to the reaction chamber and (j) repeating the process beginning with step (a) until the desired layer thickness is obtained.

Silicon precursors which may be used as starting materials with oxygen to prepare the thick abrasive coating include tetraethoxysilane and silicon alkoxide precursors such as methyldimethoxysilane having the formula

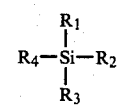

wherein $R_1$ is selected from the group consisting of H and $CH_3$, $R_2$ and $R_3$ are independently selected from the group consisting of H, $CH_3$, $OCH_3$ and $OC_2H_5$ and $R_4$ is selected from the group consisting of $OCH_3$ and $OC_2H_5$.

These layers may be used as protective coatings, abrasive media and the like. When the layers are used as abrasive media, the substrate must be able to absorb shock and vibration. Suitable substrate materials include rubbers, plastics, metal-coated plastics and the like. Especially suitable substrates are vinyl and vinyl overcoated with about 200 angstroms of a metal which may be sputtered from a target, for example, Inconel 600, a commercially available alloy (International Nickel Co.) comprising about 16 weight percent of chromium, about 76 weight percent of nickel and about 8 weight percent of iron.

A suitable glow discharge apparatus 10 for depositing an abrasive layer is shown in the FIGURE. The glow discharge apparatus 10 includes a vacuum chamber 12 such as a bell jar. In the vacuum chamber are two electrodes 14 and 18 which can be a screen, coil or plate of a material that is a good electrical conductor such as platinum or graphite. The electrodes 14 and 18 are connected to an external power source 16 which may be DC or AC. There will be a voltage potential between the electrodes 14 and 18. When low pressures and current frequencies other than radio frequencies are used, the plasma is enhanced by means of magnets on the electrodes 14 and 18.

A first outlet 20 into the vacuum chamber 12 allows for evacuation of the system and is connected to a mechanical-diffusion pump system. Inlets 22 and 24 respectively are connected to glass bleed systems for adding gases as needed in the coating process. In carrying out the coating process the substrate 26 to be coated is placed between the electrodes typically maintained about 5 to 10 centimeters apart. The vacuum chamber 12 is then evacuated to a pressure of about 0.5 to $1 \times 10^{-6}$ millimeters of mercury through outlet 20. Oxygen is added through first inlet 22 and the silicon precursor is added through second inlet 24.

A glow discharge is initiated between the electrodes 14 and 18 by energizing the power source 16, whereupon deposition of the abrasive layer on the substrate 26 begins. The current density should be in the range of about 1-5 milliamps per square centimeter at 10 kilohertz. The potential between electrodes 14 and 18 is about 500-1000 volts. Under these conditions the abrasive layer will be deposited at the rate of about 40-80 angstroms per minute.

A vinyl substrate 26, whether or not metal coated, may warp due to stress relaxation when heated above about 50° C. Other substrate materials having different temperatures above which undesirable phenomena may occur can also be used in which case the procedure described below would be followed when that material's critical temperature is approached. Therefore, during the glow discharge deposition of the abrasive coating, when the substrate 26 temperature approaches 50° C., the silicon precursor source inlet 24, glow discharge power supply 16 and oxygen source inlet 22 are in turn shut off and the system allowed to cool until the substrate temperature is reduced to about 25° C. When a vinyl substrate 26 is used, about 5 minutes are required to cool the substrate to 25° C.

Oxygen is then readmitted through the first inlet 22 so that the partial pressure of oxygen in the bell jar 12 is from about 20 to about 25 micrometers of mercury. The power supply 16 is activated and the $SiO_x$ covered substrate is subjected to the glow discharge in the presence of oxygen alone for from about 15 to about 25 seconds. The power supply 16 is then turned off. The silicon precursor is readmitted through the second inlet 24. The power supply 16 is again activated and the $SiO_x$ deposition process repeated.

The use of oxygen alone on restart of the glow discharge, is particularly critical. It is believed that this step either etches off or oxidizes some of the outer layer molecules so that new layers deposited on this treated surface exhibit the desired adhesive and abrasive properties. When the oxygen only glow discharge step is omitted, poor adhesion and inhomogeneity of the resultant layer results and the layer is also less abrasive. The use of the oxygen glow discharge intermediate step should also be useful for other glow discharge depositions to produce thick layers which require stepwise deposition, even where the desired layer need not have any abrasive qualities.

It was found that when methyldimethoxysilane is used with oxygen suitable $SiO_x$ coatings rich in $SiO_2$ could be prepared where the ratio of the relative partial pressures of oxygen and methyldimethoxysilane vary from about 4.0 to about 1.5 with a total pressure range of from about 30 to about 50 micrometers of mercury. After about 3 to 4 minutes, when about 250 to 300 angstroms of $SiO_2$ has been deposited on a vinyl substrate, the substrate reaches 50° C.

The invention will be further illustrated by the following Examples, but it is to be understood that the invention is not meant to be limited to the details described therein.

EXAMPLE 1

A vinyl disc substrate 26 having a diameter of 30.5 cm and a thickness of 0.18 cm is placed in the glow discharge deposition apparatus 10 shown in the FIGURE. Electrodes 14 and 18 are 8 cm apart and the substrate 26 is placed between them. The vacuum chamber 12 is evacuated through outlet 20 to a pressure of $5 \times 10^{-7}$ millimeters of mercury. Oxygen is admitted through first inlet 22 so that its partial pressure in the vacuum chamber 12 is 25 micrometers of mercury. The system is allowed to stabilize for about two minutes. Methyldimethoxysilane is admitted through second inlet 24 so that its partial pressure in the vacuum chamber 12 is 11 micrometers of mercury. The system is allowed to stabilize for about one minute.

A glow discharge is initiated by activating the power supply 16. The frequency is 10 kilohertz and the power density is 1 watt/cm$^2$. The glow discharge is continued for four minutes. The supply of methyldimethoxysilane through second inlet 24 is shut off. The power supply 16 is turned off and the oxygen supply through inlet 22 is shut off. The system is evacuated through outlet 20 and after five minutes the pressure in vacuum chamber 12 is $5 \times 10^{-6}$ millimeters of mercury.

Oxygen is then readmitted through first inlet 22 to a partial pressure of 25 micrometers of mercury, and the system is allowed to stabilize for about two minutes. The power supply 16 is turned on. It is operated at a frequency of 10 kilohertz and provides a power density of 1 watt/cm$^2$. The resulting glow discharge supported by oxygen is allowed to continue for 20 seconds after which the power supply 16 is turned off. Methyldimethoxysilane is then admitted through second inlet 24 so that its partial pressure in vacuum chamber 12 is 11 micrometers of mercury. The system is allowed to stabilize for about one minute. The glow discharge is then initiated by activating power supply 16.

The above process was repeated until a layer about 640 angstroms thick is deposited. Three glow discharge depositions of methyldimethoxysilane and oxygen are required.

The layer appears to be continuous, amorphous and homogeneous. The layer exhibits good adhesion and hardness when it is subjected to scratch tests using a conventional microhardness tester. X-ray fluorescence measurements on four separated parts of the disc indicate good uniformity of composition and thickness with standard deviations of less than 10 percent for Si.

The thickness of the sample is estimated based on the measured rate of deposition on Si wafers as determined by ellipsometry.

EXAMPLE 2

The method of Example 1 is followed using a 30.5 cm diameter, 0.18 cm thick vinyl disc substrate to deposit a $SiO_x$ film about 2100 angstroms thick. Seven glow discharge depositions were required using methyldimethoxysilane and oxygen. The physical and chemical properties are determined as in Example 1 and are found to be similar.

CONTROL

The method of Example 1 is followed using a 30.5 cm diameter, 0.18 cm thick vinyl disc to deposit a $SiO_x$ layer about 2100 angstroms thick except that the oxygen glow-discharge step is omitted. Seven glow discharge depositions using oxygen and methyldimethoxysilane are required to produce a layer of the desired thickness. After the third to fourth deposition when the deposited layer is about 1000 angstroms thick, the layer's surface appears spotty and exhibits a localized powdery structure. These defects continue to worsen as the layer thickness increases.

The layer after the deposition procedure is completed, has poor adhesion and cohesion as determined by the microhardness tester scratch test. Bare spots are observed where the layer did not cover the substrate. X-ray fluorescence measurements indicate a high degree of inhomogeneity.

We claim:

1. In a method for depositing a thick, amorphous, continuous layer of $SiO_x$ onto a substrate which comprises depositing a series of thin layers by glow discharge of an organosilane and oxygen, interrupting the deposition as required, the improvement which comprises initiating the glow discharge in oxygen after each interruption and prior to a subsequent deposition.

2. In a method for depositing a thick, amorphous, continuous abrasive layer of $SiO_x$ onto a temperature sensitive substrate which comprises depositing a series of thin layers by glow discharge of an organosilane and oxygen, interrupting the deposition as required to maintain the temperature of the substrate below its degradation temperature, the improvement which comprises initiating the glow discharge in oxygen after each interruption and prior to a subsequent deposition.

3. The method of claim 2 wherein the organosilane has the formula

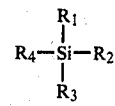

wherein $R_1$ is selected from the group consisting of H and $CH_3$, $R_2$ and $R_3$ are independently selected from the group consisting of H, $CH_3$, $OCH_3$ and $OC_2H_5$ and $R_4$ is selected from the group consisting of H and $CH_3$.

4. The method of claim 3 wherein the organosilane is methyldimethoxysilane.

5. The method of claim 2 wherein the organosilane is tetraethoxysilane.

6. The method of claim 2 wherein the partial pressure of oxygen during the glow discharge in an oxygen atmosphere is from about 20 to about 25 micrometers of mercury.

7. The method of claim 2 wherein the substrate is vinyl.

8. The method of claim 2 wherein the thick $SiO_x$ layer is at least about 1000 angstroms thick.

* * * * *